(12) United States Patent
Christoph et al.

(10) Patent No.: US 10,135,413 B2
(45) Date of Patent: Nov. 20, 2018

(54) AUTOMATIC TIMBRE CONTROL

(71) Applicant: HARMAN BECKER AUTOMOTIVE SYSTEMS GMBH, Karlsbad (DE)

(72) Inventors: Markus Christoph, Straubing (DE); Leander Scholz, Salching (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 0 days.

(21) Appl. No.: 14/906,705

(22) PCT Filed: Jul. 2, 2014

(86) PCT No.: PCT/EP2014/064056
§ 371 (c)(1),
(2) Date: Jan. 21, 2016

(87) PCT Pub. No.: WO2015/010865
PCT Pub. Date: Jan. 29, 2015

(65) Prior Publication Data
US 2016/0181999 A1 Jun. 23, 2016

(30) Foreign Application Priority Data
Jul. 22, 2013 (EP) ..................................... 13177452

(51) Int. Cl.
*H04R 29/00* (2006.01)
*H03G 3/30* (2006.01)
(Continued)

(52) U.S. Cl.
CPC ............. *H03G 3/3005* (2013.01); *H04R 3/04* (2013.01); *H04R 29/001* (2013.01); *H04S 7/301* (2013.01)

(58) Field of Classification Search
CPC .......... H04R 29/001; H04R 3/04; H04R 3/00; H03G 5/165; H03G 3/20; H03G 3/32; H04S 7/301; H04S 7/307; H04S 2420/07
(Continued)

(56) References Cited

U.S. PATENT DOCUMENTS 4,888,809 A 12/1989 Knibbeler
7,333,618 B2 2/2008 Shuttleworth et al.
(Continued)

FOREIGN PATENT DOCUMENTS

CN 1312537 A 9/2001
CN 1450521 A 10/2003
(Continued)

OTHER PUBLICATIONS

James Johnston, Estimation of perceptual entropy using nosie masking criteria,1988,2524-2527.*
(Continued)

*Primary Examiner* — Alexander Jamal
(74) *Attorney, Agent, or Firm* — Brooks Kushman P.C.

(57) ABSTRACT

A system and method for automatically controlling the timbre of a sound signal in a listening room are also disclosed, which include the following: generating an acoustic sound output from an electrical sound signal; measuring the total acoustic sound level in the room and generating an electrical total sound signal representative of the total acoustic sound level in the room, wherein the total acoustic sound comprises the acoustic sound output generated from the electrical sound signal; and adjusting the gain of the electrical sound signal dependent on a room-dependent gain signal, the room-dependent gain signal being determined from reference room data and estimated room data.

17 Claims, 3 Drawing Sheets

(51) Int. Cl.
*H04S 7/00* (2006.01)
*H04R 3/04* (2006.01)

(58) Field of Classification Search
USPC .......... 381/59, 101, 102, 103, 107, 109, 122
See application file for complete search history.

(56) References Cited

U.S. PATENT DOCUMENTS

| | | | | |
|---|---|---|---|---|
| 2006/0098827 | A1* | 5/2006 | Paddock | G10L 21/02 |
| | | | | 381/106 |
| 2009/0097676 | A1 | 4/2009 | Seefeldt | |
| 2009/0274312 | A1 | 11/2009 | Howard et al. | |
| 2010/0211388 | A1 | 8/2010 | Yu et al. | |
| 2010/0239097 | A1 | 9/2010 | Trautmann et al. | |
| 2011/0081024 | A1 | 4/2011 | Soulodre | |
| 2012/0063614 | A1 | 3/2012 | Crockett et al. | |
| 2013/0066453 | A1 | 3/2013 | Seefeldt | |
| 2013/0070927 | A1 | 3/2013 | Harma | |
| 2013/0136282 | A1* | 5/2013 | McClain | H03G 3/32 |
| | | | | 381/316 |
| 2013/0294614 | A1 | 11/2013 | Bharitkar et al. | |

FOREIGN PATENT DOCUMENTS

| | | |
|---|---|---|
| CN | 1568502 A | 1/2005 |
| CN | 1659927 A | 8/2005 |
| CN | 1662101 A | 8/2005 |
| CN | 1956606 A | 5/2007 |
| CN | 101296529 A | 10/2008 |
| CN | 101361405 A | 2/2009 |
| CN | 101491116 A | 7/2009 |
| CN | 101719368 A | 6/2010 |
| CN | 102081229 A | 6/2011 |
| CN | 102475554 A | 5/2012 |
| CN | 102893633 A | 1/2013 |
| EP | 0165733 A2 | 12/1985 |
| EP | 1619793 A1 | 1/2006 |
| EP | 1986466 A1 | 10/2008 |
| EP | 2575378 A1 | 4/2013 |
| WO | 2007076863 A1 | 7/2007 |
| WO | 2011151771 A1 | 12/2011 |

OTHER PUBLICATIONS

Ted Painter, A Review of Algorithms for Perceptual Coding of Digital Audio Signals, 1977,IEEE,179-208.*
International Search Report and Written Opinion for corresponding Application No. PCT/EP2014/064056, dated Sep. 29, 2014, 11 pages.
Rocha et al., "Adaptive Audio Equalization of Rooms based on a Technique of Transparent Insertion of Acoustic Probe Signals", Audio Engineering Society, Convention Paper 6738, May 20-23, 2006, Paris, France, 18 pages.
Perez et al., "Automatic Gain and Fader Control For Live Mixing", IEEE Workshop on Applications of Signal Processing to Audio and Acoustics, Oct. 18-21, 2009, New Paltz, NY, 4 pages.
Christoph et al., "Noise Dependent Equalization Control", 48th International Conference, Automotive Audio, Sep. 21, 2012, New York, NY, 10 pages.
International Search Report and Written Opinion for corresponding Application No. PCT/EP2014/064055, dated Nov. 19, 2014, 20 pages.
Chinese Office Action and English translation for Application No. 201480041253.1, dated Nov. 4, 2016, 29 pages.
Chinese Office Action for Application No. 201480041450, dated Dec. 13, 2016, 6 pages.

* cited by examiner

AUTOMATIC TIMBRE CONTROL

CROSS-REFERENCE TO RELATED APPLICATION

This application is the U.S. national phase of PCT Application No. PCT/EP2014/064056 filed on 2 Jul. 2014, which claims priority to EP Application No. 13177452.3 filed on 22 Jul. 2013, the disclosures of which are incorporated in their entirety by reference herein.

TECHNICAL FIELD

The disclosure relates to a system and method (generally referred to as a "system") for processing signals, in particular audio signals.

BACKGROUND

The sound that a listener hears in a room is a combination of the direct sound that travels straight from the sound source to the listener's ears and the indirect reflected sound—the sound from the sound source that bounces off the walls, floor, ceiling and objects in the room before it reaches the listener's ears. Reflections can be both desirable and detrimental. This depends on their frequency, level and the amount of time it takes the reflections to reach the listener's ears following the direct sounds produced by the sound source. Reflected sounds can make music and speech sound much fuller and louder than they otherwise would. Reflected sound can also add a pleasant spaciousness to an original sound. However, these same reflections can also distort sound in a room by making certain notes sound louder while canceling out others. The reflections may also arrive at the listener's ears at a time so different from the sound from the sound source that, for example, speech intelligibility may deteriorate and music may not be perceived by the listener.

Reflections are heavily influenced by the acoustic characteristics of the room, its "sonic signature". There are many factors that influence the "sonic signature" of a given room, the most influential being room size, rigidity, mass and reflectivity. The dimensions of the room (and their ratios) highly influence the sound in a listening room. The height, length and width of the room determine the resonant frequencies of the space and, to a great degree, where sound perception is optimum. Rigidity and mass both play significant roles in determining how a given space will react to sound within. Reflectivity is, in simple terms, the apparent "liveness" of a room, also known as reverb time, which is the amount of time it takes for a pulsed tone to decay to a certain level below its original intensity. A live room has a great deal of reflectivity, and hence a long reverb time. A dry room has little reflectivity, and hence a short reverb time. As can be seen, changing the characteristics of a room (e.g., by opening a door or window, or by changing the number of objects or people in the room) may dramatically change the acoustic of the perceived sound (e.g., the tone color or tone quality).

Tone color and tone quality are also known as "timbre" from psychoacoustics, which is the quality of a musical note, sound or tone that distinguishes different types of sound production, such as voices and musical instruments, (string instruments, wind instruments and percussion instruments). The physical characteristics of sound that determine the perception of timbre include spectrum and envelope. In simple terms, timbre is what makes a particular musical sound different from another, even when they have the same pitch and loudness. For instance, it is the difference between a guitar and a piano playing the same note at the same loudness.

Particularly in small rooms such as vehicle cabins, the influence of variations in the room signature on the timbre of a sound generated and listened to in the room is significant and is often perceived as annoying by the listener.

SUMMARY

A system for automatically controlling the timbre of a sound signal in a listening room is disclosed. The system comprises a loudspeaker configured to generate an acoustic sound output from an electrical sound signal; a microphone configured to generate a total electrical sound signal representative of the total acoustic sound in the room, wherein the total acoustic sound comprises the acoustic sound output from the loudspeaker within the room; and a room-dependent gain-shaping block configured to receive the electrical sound signal and to adjust the gain of the electrical sound signal dependent on a room-dependent gain signal, the room-dependent gain signal being determined from reference room data and estimated room data.

A method for automatically controlling the timbre of a sound signal in a listening room is also disclosed. The method comprises generating an acoustic sound output from an electrical sound signal; measuring the total acoustic sound level in the room; and generating an electrical total sound signal representative of the total acoustic sound level in the room, wherein the total acoustic sound comprises the acoustic sound output generated from the electrical sound signal and adjusting the gain of the electrical sound signal dependent on a room-dependent gain signal, the room-dependent gain signal being determined from reference room data and estimated room data.

Other systems, methods, features and advantages will be, or will become, apparent to one with skill in the art upon examination of the following figures and detailed description. It is intended that all such additional systems, methods, features and advantages be included within this description, be within the scope of the invention and be protected by the following claims.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

In the following, gain can be positive (amplification) or negative (attenuation) as the case may be. The expression "spectral gain" is used herein for gain that is frequency dependent (gain over frequency) while "gain" can be frequency dependent or frequency independent as the case may be. "Room dependent gain" is gain that is influenced by the acoustic characteristics of a room under investigation. "Gain shaping" or "equalizing" means (spectrally) controlling or varying the (spectral) gain of a signal. "Loudness" as used herein is the characteristic of a sound that is primarily a psychological correlate of physical strength (amplitude).

Many known acoustic control systems exhibit issues with estimating a (robust) room impulse response (RIR), i.e., an RIR that is insensitive to external influences such as background noise (closing a vehicle door, wind noise, etc.), which may deteriorate the signal-to-noise (SNR) ratio. The occurring noise distracts the adaption process; the system tries to adapt to the noise and then again to the original signal. This process takes a period of time, during which the system is not accurately adapted.

Figure 1:
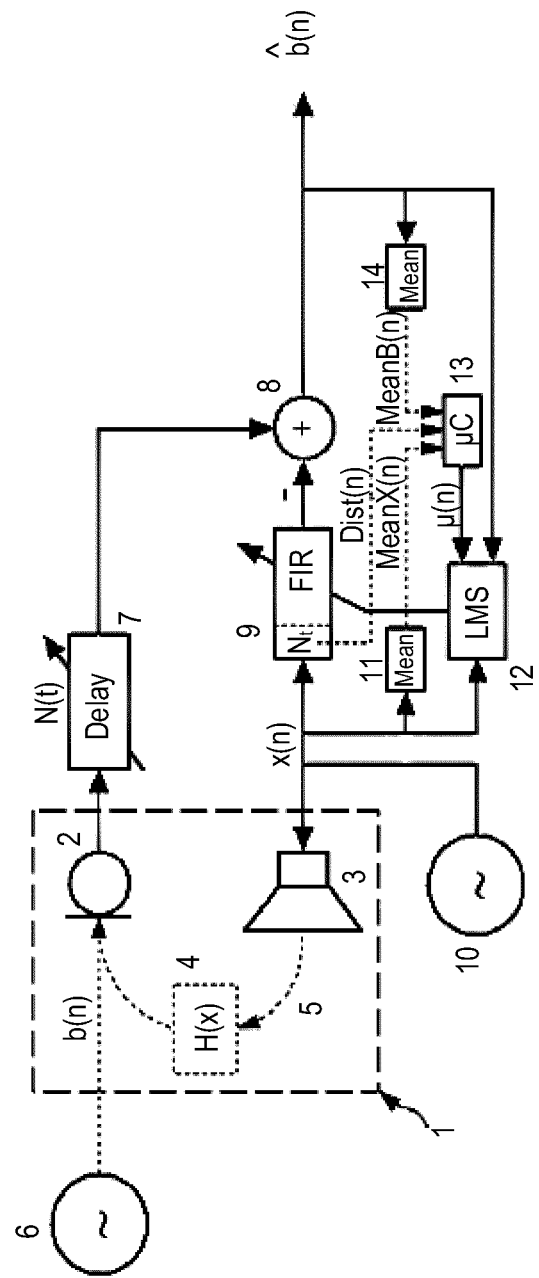
FIG. 1 is a block diagram of an exemplary system for adaptive estimation of an unknown room impulse response (RIR) using the delayed coefficients method.

An exemplary system for adaptive estimation of an unknown RIR using the delayed coefficients method as shown in FIG. 1, includes loudspeaker room microphone (LRM) arrangement 1, microphone 2 and loudspeaker 3 in room 4, which could be, e.g., a cabin of a vehicle. Desired sound representing audio signal x(n) is generated by loudspeaker 3 and then transferred to microphone 2 via signal path 5 in and dependent on room 4, which has the transfer function H(x). Additionally, microphone 2 receives the undesired sound signal b(n), also referred to as noise, which is generated by noise source 6 outside or within room 4. For the sake of simplicity, no distinction is made between acoustic and electrical signals under the assumption that the conversion of acoustic signals into electrical signals and vice versa is 1:1.

The undesired sound signal b(n) picked up by microphone 2 is delayed by way of delay element 7, with a delay time represented by length N(t), which is adjustable. The output signal of delay element 7 is supplied to subtractor 8, which also receives an output signal from a controllable filter 9 and which outputs output signal $\hat{b}(n)$. Filter 9 may be a finite impulse response (FIR) filter with filter length N that provides signal Dist(n), which represents the system distance and whose transfer function (filter coefficients) can be adjusted with a filter control signal. The desired signal x(n), provided by a desired signal source 10, is also supplied to filter 9, mean calculation 11, which provides signal Mean X(n), and adaptation control 12, which provides the filter control signal to control the transfer function of filter 9. Adaptation control 12 may employ the least mean square (LMS) algorithm (e.g., a normalized least mean square (NLMS) algorithm) to calculate the filter control signals for filter 9 from the desired signal x(n), output signal $\hat{b}$ and an output signal representing adaptation step size μ(n) from adaptation step size calculator (μC) 13. Adaptation step size calculator 13 calculates adaptation step size μ(n) from signal Dist(n), signal Mean X(n) and signal MeanB(n). Signal MeanB(n) represents the mean value of output signal $\hat{b}(n)$ and is provided by mean calculation block 14, which is supplied with output signal $\hat{b}(n)$.

The NLMS algorithm in the time domain, as used in the system of FIG. 1, is as follows:
$y(n) = h(n)x(n)^T$,
$\hat{b}(n) = e(n) = \hat{d}(n) - y(n)$, $$\hat{h}(n+1) = \hat{h}(n) + \mu(n) \frac{e(n)x(n)}{\|x(n)\|^2}$$

in which
$\hat{h}(n) = [\hat{h}_0(n), \hat{h}_1(n), \ldots, \hat{h}_{N-1}(n)]$,
$x(n) = [x(n), x(n-1), \ldots, x(n-N+1)]$,
N=length of the FIR filter,
$\hat{d}(n)$=nth sample of the desired response (delayed microphone signal)
$\hat{h}(n)$=filter coefficients of the adaptive (FIR) filters at a point in time (sample) n,
x(n)=input signal with length N at the point in time (sample) n,
$\hat{b}(n) = e(n)$=nth sample of the error signal,
y(n)=nth sample of the output signal of the adaptive (FIR) filter,
μ(n)=adaptive adaption step size at the point in time (sample) n,
$\|x\|^2$=2-part norm of vector x,
$(x)^T$=transpose of vector x.

For the determination of adaptive adaptation step size μ(n) in the above equation, the delayed coefficients method may be used, which can be described as follows:
μ(n)=Dist(n)SNR(n), $$Dist(n) = \frac{1}{N_t} \sum_{i=1}^{N_t} |\hat{h}_i(n)|,$$

$$SNR(n) = \frac{\overline{|x(n)|}}{\overline{|\hat{b}(n)|}}$$

whereby $\overline{|x(n)|} = \alpha_x |x(n)| + (1-\alpha_x)$ $$\overline{|\hat{b}(n)|} = \alpha_{\hat{b}} |\hat{b}(n)| + (1 - \alpha_{\hat{b}}) \overline{|\hat{b}(n-1)|},$$

in which
Dist(n)=estimated system difference (difference between estimated and actual RIR) at the point in time (sample) n,
SNR(n)=estimated SNR at the point in time (sample) n,
$N_t$=number of filter coefficients of the adaptive (FIR) filter to be used as delayed coefficients method ($N_t$=[5, . . . , 20]), $\overline{|x(n)|}$=smoothed input signal x(n) at the point in time (sample) n, $\overline{|\hat{b}(n)|}$ = smoothed error signal $\hat{b}(n)$ at the point in time (sample) n, $\alpha_x$ smoothing coefficient for input signal x(n)($\alpha_x \approx 0.99$),
$\alpha_{\hat{b}}$ smoothing coefficient for error signal b(n)($\alpha_{\hat{b}} \approx 0.999$).

As can be seen from the above equations, adaptive adaptation step size μ(n) can be derived from the product of estimated current SNR(n) and estimated current system distance Dist(n). In particular, estimated current SNR(n) can be calculated as the ratio of the smoothed magnitude of input signal $\overline{|x(n)|}$, which represents the "signal" in SNR(n), and the smoothed magnitude of error signal $\overline{|\hat{b}(n)|}$, which represents the "noise" in SNR(n). Both signals can be easily derived from any suitable adaptive algorithm. The system of FIG. 1 uses a dedicated delayed coefficients method to estimate the current system distance Dist(n), in which a predetermined delay ($N_t$) is implemented into the microphone signal path. The delay serves to derive an estimation of the adaptation quality for a predetermined part of the filter (e.g., the first $N_t$ coefficients of the FIR filter). The first $N_t$ coefficients are ideally zero since the adaptive filter first has to model a delay line of $N_t$ coefficients, which are formed by $N_t$ times zero. Therefore, the smoothed (mean) magnitude of the first $N_t$ coefficients of the FIR filter, which should ideally be zero, is a measure of system distance Dist(n), i.e., the variance of results for the estimated RIR and the actual RIR. The system shown in FIG. 1 allows for an accurate estimation of the RIR even when temporary noise is present.

Adaption quality may also deteriorate when a listener makes use of the fader/balance control since here again the RIR is changed. One way to make adaption more robust towards this type of disturbance is to save the respective RIR for each fader/balance setting. However, this approach requires a major amount of memory. What would consume less memory is to just save the various RIRs as magnitude frequency characteristics. Further reduction of the amount of memory may be achieved by employing a psychoacoustic frequency scale, such as the Bark, Mel or ERB frequency scale, with the magnitude frequency characteristics. Using the Bark scale, for example, only 24 smoothed (averaged) values per frequency characteristic are needed to represent an RIR. In addition, memory consumption can be further decreased by way of not storing the tonal changes, but employing different fader/balance settings, storing only certain steps and interpolating in between in order to get an approximation of the current tonal change.

Figure 2:
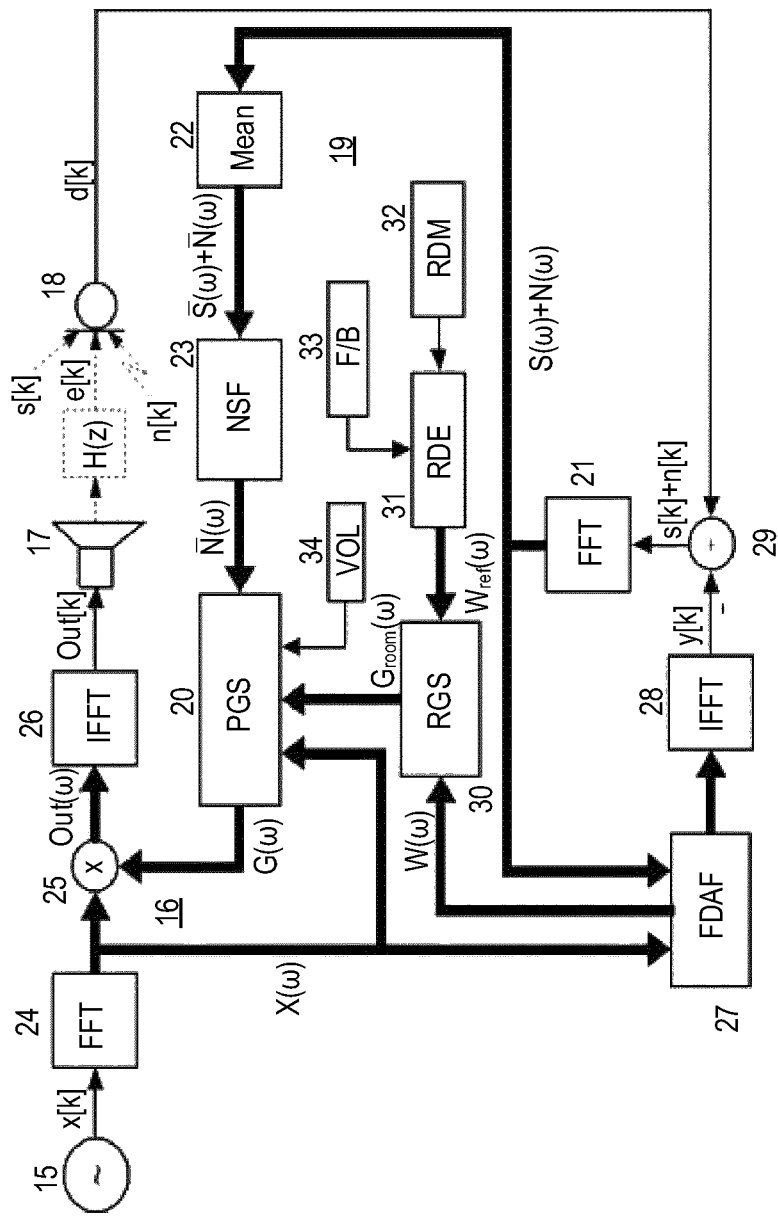
FIG. 2 is a block diagram of an exemplary automatic timbre control system employing a dynamic equalization system.

An implementation of the system of FIG. 1 in a dynamic equalizing control (DEC) system in the spectral domain is illustrated in FIG. 2, in which the adaptive filter (9, 12 in the system of FIG. 1) is also implemented in the spectral domain. There are different ways to implement an adaptive filter in the spectral domain, but for the sake of simplicity, only the overlap save version of a frequency domain adaptive filter (FDAF) is described.

In the system of FIG. 2, signal source 15 supplies a desired signal (e.g., music signal x[k] from a CD player, radio, cassette player or the like) to a gain shaping block such as spectral dynamic equalization control (DEC) block 16, which is operated in the frequency domain and provides equalized signal Out[k] to loudspeaker 17. Loudspeaker 17 generates an acoustic signal that is transferred to microphone 18 according to transfer function H(z). The signal from microphone 18 is supplied to multiplier block 25, which includes a multiplicity of multipliers, via a spectral voice suppression block 19 and a psychoacoustic gain-shaping block 20 (both operated in the frequency domain).

Voice suppression block 19 comprises fast Fourier transform (FFT) block 21 for transforming signals from the time domain into the frequency domain. In a subsequent mean calculation block 22, the signals in the frequency domain from FFT block 21 are averaged and supplied to nonlinear smoothing filter (NSF) block 23 for smoothing spectral components of the mean signal from mean calculation block 22. The signals from NSF block 23 are supplied to psychoacoustic gain-shaping (PSG) block 20, receiving signals from and transmitting signals to the spectral DEC block 16. DEC block 16 comprises FFT block 24, multiplier block 25, inverse fast Fourier transform (IFFT) block 26 and PSG block 20. FFT block 24 receives signal x[k] and transforms it into the spectral signal $X(\omega)$. Signal $X(\omega)$ is supplied to PSG block 20 and multiplier block 25, which further receives signal $G(\omega)$, representing spectral gain factors from PSG block 20. Multiplier 25 generates a spectral signal Out($\omega$), which is fed into IFFT block 26 and transformed to provide signal Out[k].

An adaptive filter operated in the frequency domain such as frequency domain (overlap save) adaptive filter (FDAF) block 27 receives the spectral version of error signal s[k]+n[k], which is the difference between microphone signal d[k] and the estimated echo signal y[n]; microphone signal d[k] represents the total sound level in the environment (e.g., an LRM system), wherein the total sound level is determined by sound output e[k] from loudspeaker 17 as received by microphone 18, ambient noise n[k] and, as the case may be, impulse-like disturbance signals such as speech signal s[k] within the environment. Signal $X(\omega)$ is used as a reference signal for adaptive filter 27. The signal output by FDAF block 27 is transferred to IFFT block 28 and transformed into signal y[k]. Subtractor block 29 computes the difference between signal y[k] and microphone signal d[k] to generate a signal that represents the estimated sum signal n[k]+s[k] of ambient noise n[k] and speech signal s[k], which can also be regarded as an error signal. The sum signal n[k]+s[k] is transformed by FFT block 21 into a respective frequency domain sum signal $N(\omega)+S(\omega)$, which is then transformed by mean calculation block 22 into a mean frequency domain sum signal $\overline{N}(\omega)+\overline{S}(\omega)$. Mean frequency domain sum signal $\overline{N}(\omega)+\overline{S}(\omega)$ is then filtered by NSF block 23 to provide a mean spectral noise signal $\overline{N}(\omega)$.

The system of FIG. 2 further includes a room-dependent gain-shaping (RGS) block 30, which receives signal $W(\omega)$, representing the estimated frequency response of the LRM system (RTF) from FDAF block 27, and reference signal $W_{ref}(\omega)$, representing a reference RTF provided by reference data election (RDE) block 31, which elects one of a multiplicity of RTF a reference stored in reference data memory (RDM) block 32 according to a given fader/balance setting provided by fader/balance (F/B) block 33. RGS block 30 compares the estimated RTF with the reference RTF to provide room-dependent spectral gain signal $G_{room}(\omega)$, which, together with a volume (VOL) setting provided by volume settings block 34, controls PGS block 20. PGS block 20 calculates the signal dependent on mean background noise $\overline{N}(\omega)$, the current volume setting VOL, reference signal $X(\omega)$ and room-dependent spectral gain signal $G_{room}(\omega)$; signal $G(\omega)$ represents the spectral gain factors for the equalization and timbre correction in DEC block 16. The VOL setting controls the gain of signal x[k] and, thus, of signal Out[k] provided to the loudspeaker 17.

Figure 3:
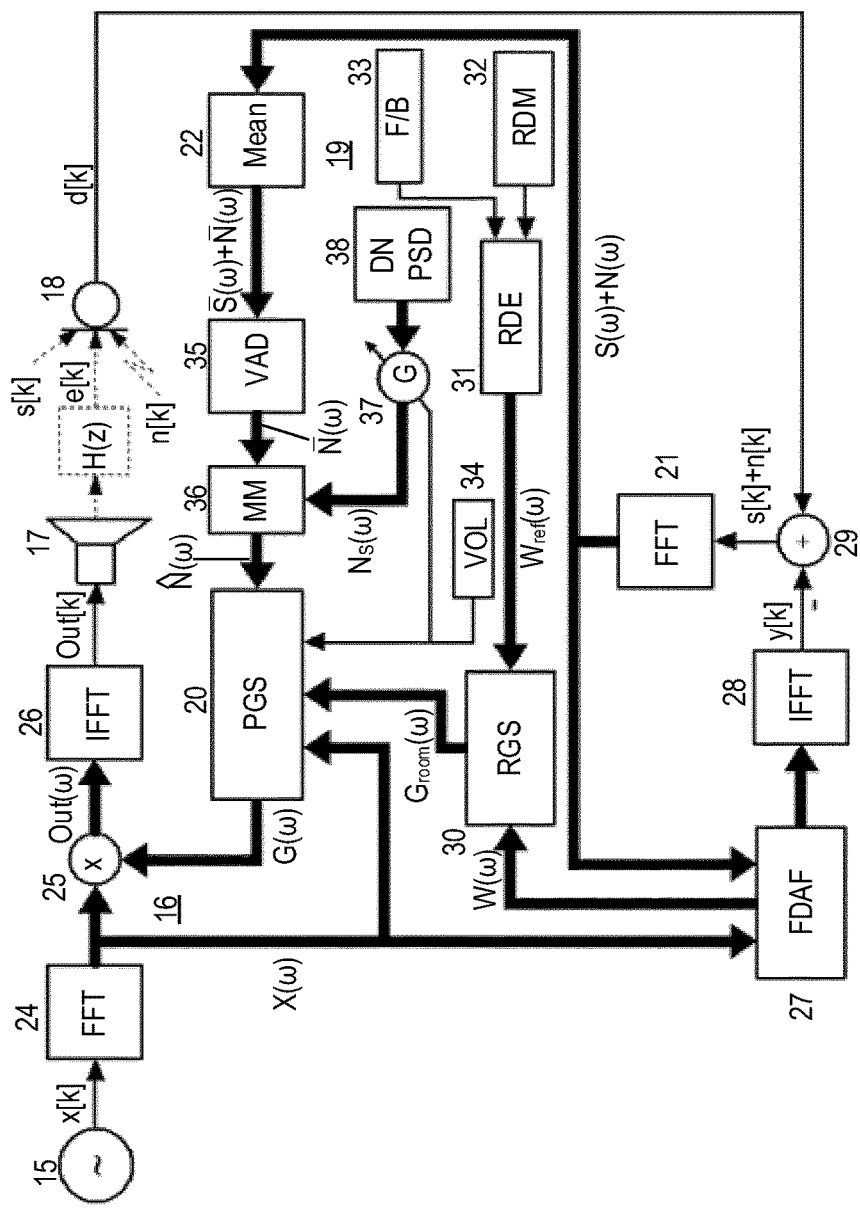
FIG. 3 is a block diagram of an exemplary automatic timbre control system employing a dynamic equalization system and an automatic loudness control system.

The system of FIG. 1 may be subject to various structural changes such as the changes that have been made in the exemplary system shown in FIG. 3. In the system of FIG. 3, NSF block 23 is substituted by voice activity decoder (VAD) block 35. Additionally, the gain shaping block, which is in the present example DEC block 16, includes a maximum magnitude (MM) detector block 36, which maximum magnitude (MM) detector block 36 is inserted, which compares the estimated mean background noise $\overline{N}(\omega)$ with a previously stored reference value, provided by block 38, scaled by gain G and dependent on the current volume setting VOL so that automatic loudness control functionality is included. VAD block 35 operates similarly to NSF block 23 and provides the mean spectral noise signal $\overline{N}(\omega)$. The mean spectral noise signal $\overline{N}(\omega)$ is processed by MM detector block 36 to provide the maximum magnitude $\hat{N}(\omega)$ of the mean spectral noise signal $\overline{N}(\omega)$. MM detector block 36 takes the maximum of the mean spectral noise signal $\overline{N}(\omega)$ and signal $N_S(\omega)$, which is provided by gain control block 37, receives the desired noise power spectral density (DNPSD) from block 38 and is controlled by the volume settings VOL from volume settings block 34.

The systems presented herein allow for the psychoacoustically correct calculation of dynamically changing background noise, the psychoacoustically correct reproduction of the loudness and the automatic correction of room-dependent timbre changes.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

The invention claimed is:

1. A system for automatically controlling a timbre of sound in a listening room, comprising:
   a loudspeaker configured to generate an acoustic sound output from an electrical sound signal;
   a microphone configured to generate an electrical total sound signal representative of a total acoustic sound in a listening room, wherein the total acoustic sound comprises the acoustic sound output from the loudspeaker and ambient noise within the listening room; and
   a room-dependent gain-shaping block configured to receive at least one reference room data and estimated room data, the room-dependent gain-shaping block further configured to adjust a gain of the electrical sound signal dependent on a room-dependent gain signal, and to determine the room-dependent gain signal from at least one reference room data and estimated room data, wherein:
   the at least one reference room data includes at least one room impulse response for at least one fader/balance setting; and
   the estimated room data being estimated from the electrical sound signal and the electrical total sound signal.

2. The system of claim 1, wherein the room-dependent gain-shaping block is further configured to the at least one fader/balance setting and to adjust the gain of the electrical sound signal dependent on the at least one fader/balance setting.

3. The system of claim 1, wherein at least a portion of the at least one room impulse response is stored as magnitude frequency characteristics for the at least one fader/balance setting in a memory.

4. The system of claim 1, wherein a first portion of the at least one room impulse response is stored in a memory and a second portion of the at least one room impulse response is interpolated from the first portion of the stored at least one room impulse response.

5. The system of claim 1, further comprising a psychoacoustic gain-shaping block configured to adjust the gain of the electrical sound signal according to psychoacoustic parameters.

6. The system of claim 5, wherein the psychoacoustic parameters comprise a psychoacoustic frequency scale.

7. The system of claim 1, further comprising the following:
   a time-to-frequency transform block configured to receive the electrical sound signal in a time domain and to generate an electrical sound signal in a frequency domain; and
   a frequency-to-time transform block configured to receive the electrical sound signal in the frequency domain and to generate a re-transformed electrical sound signal in the time domain, wherein
   the loudspeaker is configured to generate the acoustic sound output from the re-transformed electrical sound signal.

8. A method for automatically controlling a timbre of a sound signal in a listening room, comprising:
   generating an acoustic sound output from an electrical sound signal;
   measuring a total acoustic sound level in a listening room and generating an electrical total sound signal representative of the total acoustic sound level in the listening room, wherein the total acoustic sound level comprises the acoustic sound output generated from the electrical total sound signal and ambient noise within the listening room;
   receiving at least one reference room data and estimated room data; and
   adjusting a gain of the electrical sound signal dependent on a room-dependent gain signal, the room-dependent gain signal being determined from the at least one reference room data and estimated room data, wherein:
   the at least one of the reference room data includes at least one room impulse response for at least one fader/balance setting, and
   the estimated room data being estimated from the electrical sound signal and the electrical total sound signal.

9. The method of claim 8, further comprising receiving the at least one fader/balance setting, wherein adjusting the gain of the electrical sound signal is dependent on the at least one fader/balance setting.

10. The method of claim 8, wherein at least a portion of the at least one room impulse response is stored as magnitude frequency characteristics for the at least one fader/balance setting.

11. The method of claim 8, wherein a first portion of the at least one room impulse response is stored in a memory and a second portion of the at least one room impulse response is interpolated from the first portion of the stored at least one room impulse response.

12. The method of claim 8, wherein the gain of the electrical sound signal is adjusted according to psychoacoustic parameters.

13. The method of claim 12, wherein the psychoacoustic parameters comprise psychoacoustic frequency scaling.

14. A system for automatically controlling a timbre of sound in a listening room, comprising:
   a microphone configured to generate an electrical total sound signal representative of a total acoustic sound in a listening room, wherein the total acoustic sound comprises an acoustic sound output from a loudspeaker and ambient noise within the listening room, and wherein the loudspeaker generates an acoustic sound output from an electrical sound signal; and
   a room-dependent gain-shaping block configured to receive at least one reference room data and estimated room data, the room-dependent gain-shaping block further configured to adjust a gain of the electrical sound signal dependent on a room-dependent gain signal, and to determine the room-dependent gain signal from the at least one reference room data and the estimated room data, wherein:
   the at least one reference room data includes at least one room impulse response for at least one fader/balance setting, and
   the estimated room data being estimated from the electrical sound signal and the electrical total sound signal.

15. The system of claim 14, wherein the room-dependent gain-shaping block is further configured to receive the at least one fader/balance setting and to adjust the gain of the electrical sound signal dependent on the at least one fader/balance setting.

16. The system of claim 14, wherein at least a portion of the at least one room impulse response is stored as magnitude frequency characteristics for the at least one fader/balance setting in a memory.

17. The system of claim 14, further comprising a psychoacoustic gain-shaping block configured to adjust the gain of the electrical sound signal according to psychoacoustic parameters.

* * * * *